(12) United States Patent
Kato et al.

(10) Patent No.: US 9,299,737 B2
(45) Date of Patent: Mar. 29, 2016

(54) IMAGE PICKUP DEVICE, METHOD OF MANUFACTURING THE SAME, AND IMAGE PICKUP DISPLAY SYSTEM

(71) Applicant: Japan Display Inc., Tokyo (JP)

(72) Inventors: Takayuki Kato, Tottori (JP); Kaoru Taketa, Tottori (JP); Hiroki Sugiyama, Tottori (JP); Shinya Ibuki, Tottori (JP)

(73) Assignee: Japan Display Inc., Tokyo (JP)

( * ) Notice: Subject to any disclaimer, the term of this patent is extended or adjusted under 35 U.S.C. 154(b) by 370 days.

(21) Appl. No.: 13/749,453

(22) Filed: Jan. 24, 2013

(65) Prior Publication Data

US 2013/0194239 A1    Aug. 1, 2013

(30) Foreign Application Priority Data

Feb. 1, 2012   (JP) .................. 2012-019799

(51) Int. Cl.
*H01L 27/146* (2006.01)
*H01L 31/14* (2006.01)
*H01L 31/18* (2006.01)

(52) U.S. Cl.
CPC .... *H01L 27/14636* (2013.01); *H01L 27/14658* (2013.01); *H01L 27/14692* (2013.01); *H01L 31/14* (2013.01); *H01L 31/18* (2013.01)

(58) Field of Classification Search
CPC ............. H01L 27/14658; H01L 27/14603; H01L 27/14623; H01L 27/14812; H01L 27/14607; H01L 27/14609; H01L 27/14621; H01L 27/14627; H01L 27/14636; H01L 27/14692; H01L 27/14806; H01L 27/14818; H01L 31/01

USPC ....................... 250/370.01–370.15
See application file for complete search history.

(56) References Cited

U.S. PATENT DOCUMENTS

| | | | | |
|---|---|---|---|---|
| 7,535,506 | B2 * | 5/2009 | Nomura | ............ H01L 27/14603 250/208.1 |
| 2006/0062352 | A1 * | 3/2006 | Nomura | ............ H01L 27/14603 378/98.8 |
| 2012/0175618 | A1 * | 7/2012 | Yamada | ............ H01L 27/14663 257/59 |
| 2012/0248318 | A1 * | 10/2012 | Ito | ......................... G01T 1/244 250/361 R |

FOREIGN PATENT DOCUMENTS

| | | |
|---|---|---|
| JP | 01-144675 | 6/1989 |
| JP | H11-24105 A | 1/1999 |
| JP | H11-97660 A | 4/1999 |

(Continued)

OTHER PUBLICATIONS

Japanese Office Action mailed Feb. 10, 2015 for corresponding Japanese Application No. 2012-019799.

(Continued)

*Primary Examiner* — David J Makiya
*Assistant Examiner* — Taeho Jo
(74) *Attorney, Agent, or Firm* — Michael Best & Friedrich LLP

(57) ABSTRACT

An image pickup device includes a sensor substrate. The sensor substrate includes: plural photoelectric conversion elements and driving elements for the plural photoelectric conversion elements which are formed on a substrate; wirings electrically connected to the driving elements; and a shield electrode disposed in a region between the plural photoelectric conversion elements and the wirings in a layer different from that of the wirings.

10 Claims, 13 Drawing Sheets

(56) References Cited

FOREIGN PATENT DOCUMENTS

| | | | |
|---|---|---|---|
| JP | 2003-258215 A | 9/2003 | |
| JP | 2009-238813 A | 10/2009 | |

OTHER PUBLICATIONS

Japanese Office Action issued Dec. 22, 2015 for corresponding Japanese Patent Application No. 2012-019799.

* cited by examiner

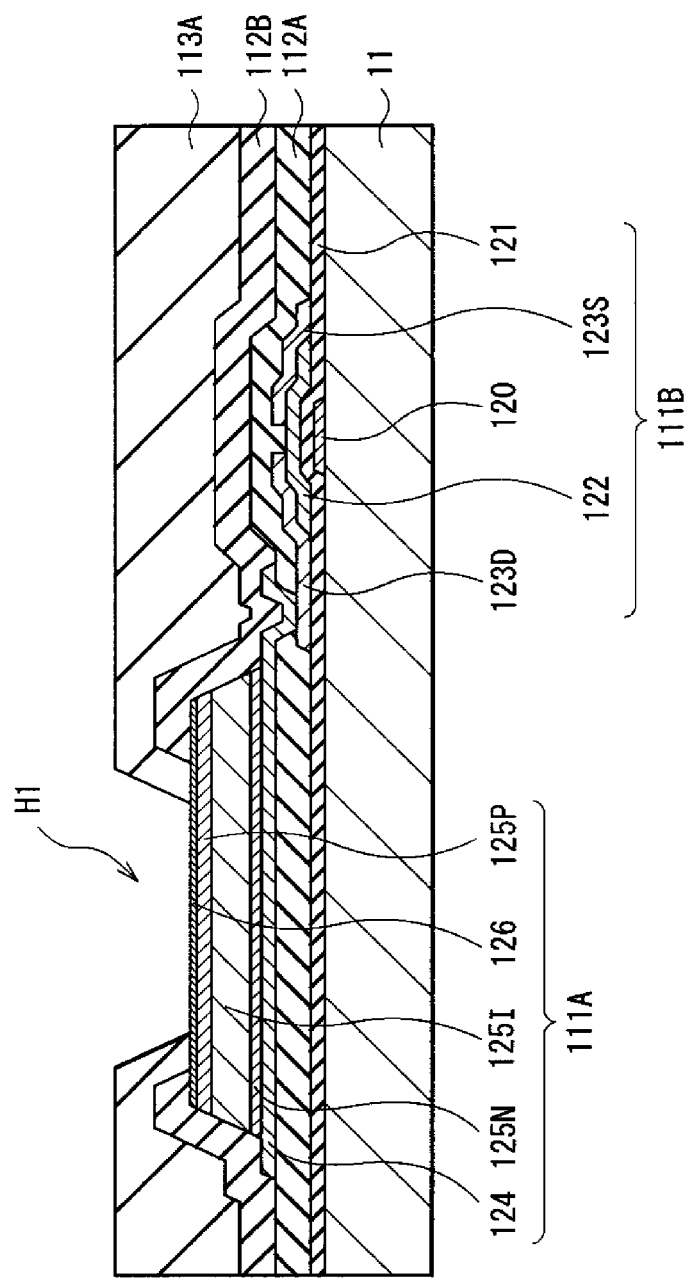

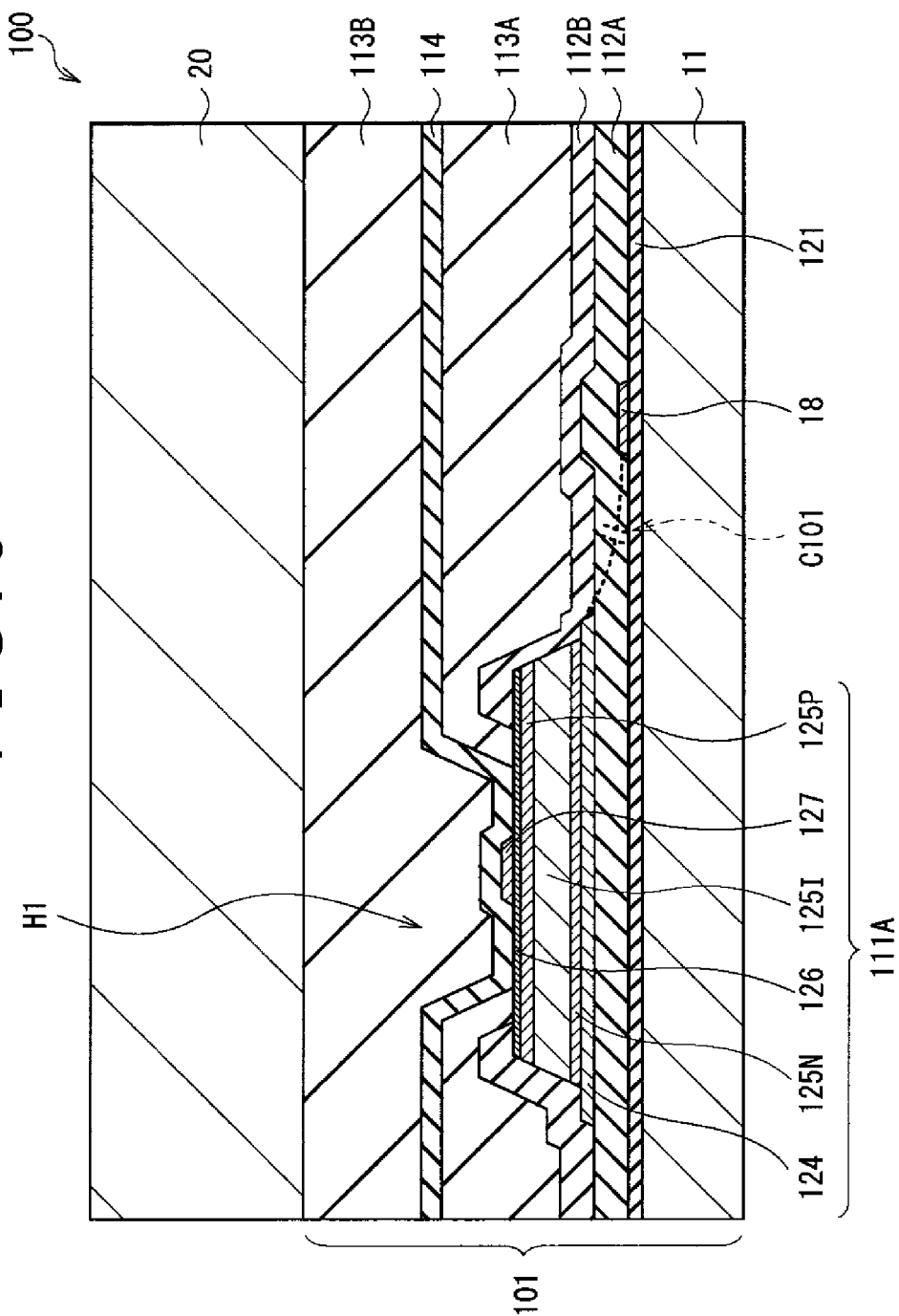

IMAGE PICKUP DEVICE, METHOD OF MANUFACTURING THE SAME, AND IMAGE PICKUP DISPLAY SYSTEM

BACKGROUND

The present disclosure relates to an image pickup device including a sensor substrate having a photoelectric conversion element, a method of manufacturing the same, and an image pickup display system including the same.

Hereinafter, various kinds of image pickup devices have been proposed as an image pickup device in which photoelectric conversion elements (photodiodes) are built in pixels (image pickup pixels). This sort of image pickup device, for example, is described in Japanese Patent Laid-Open No. Hei 01-144675. The image pickup device having such photoelectric conversion elements includes a so-called optical touch panel, a radiation image pickup device, and the like.

SUMMARY

Now, in the image pickup device as described above, in general, a captured image is obtained by driving (image pickup-driving) plural pixels. Although with regard to a technique as well for enhancing an image quality of a captured image obtained in such a manner, heretofore, various kinds of techniques have been proposed, it is desired to propose a further improving technique as well. In addition thereto, in such an image pickup device, in general, miniaturization of the image pickup device is also required.

The present disclosure has been made in order to solve the problems described above, and it is therefore desirable to provide an image pickup device in which an image quality of a captured image can be enhanced while an image pickup device is miniaturized, a method of manufacturing the same, and an image pickup display system including the same.

In order to attain the desire described above, according to an embodiment of the present disclosure, there is provided an image pickup device including: a sensor substrate; the sensor substrate including plural photoelectric conversion elements and driving elements for the plural photoelectric conversion elements which are formed on a substrate, wirings electrically connected to the driving elements, and a shield electrode disposed in a region between the plural photoelectric conversion elements and the wirings in a layer different from that of the wirings.

According to another embodiment of the present disclosure, there is provided an image pickup display system including: an image pickup device having a sensor substrate; and a display device carrying out image display based on an image pickup signal obtained from the image pickup device; the sensor substrate including plural photoelectric conversion elements and driving elements for the plural photoelectric conversion elements which are formed on a substrate, wirings electrically connected to the driving elements, and a shield electrode disposed in a region between the plural photoelectric conversion elements and the wirings in a layer different from that of the wirings.

According to still another embodiment of the present disclosure, there is provided a method of manufacturing an image pickup device, the manufacturing method including: forming a sensor substrate; the forming of the sensor substrate including forming plural photoelectric conversion elements and driving elements for the plural photoelectric conversion elements on a substrate, forming wirings electrically connected to the driving elements, and forming a shield electrode between the plural photoelectric conversion elements and the wirings in a layer different from that of the wirings.

In the image pickup device, the method of manufacturing the same, and the image pickup display system including the same according to the embodiments of the present disclosure, the shield electrode is provided in the region between the photoelectric conversion elements and the wirings for the photoelectric conversion elements in the layer different from that of the wirings electrically connected to the driving elements for the photoelectric conversion elements. The provision of such a shield electric results in the reduction of a coupling capacitance formed between the photoelectric conversion element and the wiring and the reduction of a noise component in the image pickup signal. In addition, effective utilization of the region (space) is realized as compared with the case where the shield electrode is formed in the same layer as that of the wirings.

As set forth hereinabove, according to an embodiment of the present disclosure, the shield electrode is provided in the region between the photoelectric conversion elements and the wirings for the photoelectric conversion elements in the layer different from that of the wirings electrically connected to the driving elements for the photoelectric conversion elements. Therefore, the effective utilization of the region can be realized, and the noise component in the image pickup signal can be reduced. As a result, the image quality of the captured image can be enhanced while the device is miniaturized.

BRIEF DESCRIPTION OF THE DRAWINGS

FIGS. 5A to 5G are cross sectional views explaining processes in a method of manufacturing the radiation image pickup device shown in FIG. 1;

FIG. 6 is a cross sectional view explaining a structure and an operation of a radiation image pickup device according to a comparative example for the first embodiment of the present disclosure;

DETAILED DESCRIPTION OF THE PREFERRED EMBODIMENTS

Embodiments of the present disclosure will be described in detail hereinafter with reference to the accompanying drawings. It is noted that the description will be given below in accordance with the following order.

1. First Embodiment (example of a radiation image pickup device including a shield electrode in a layer different from that of signal lines)

2. Modified Change (example of a radiation image pickup device in which a shield electrode covers a circumference of signal lines)

3. Second Embodiment (example of a radiation image pickup display system)

4. Other Modified Changes (examples of an image pickup device other than the radiation image pickup device)

1. First Embodiment

[Cross-Sectional Structure of Radiation Image Pickup Device 1]

Figure 1:
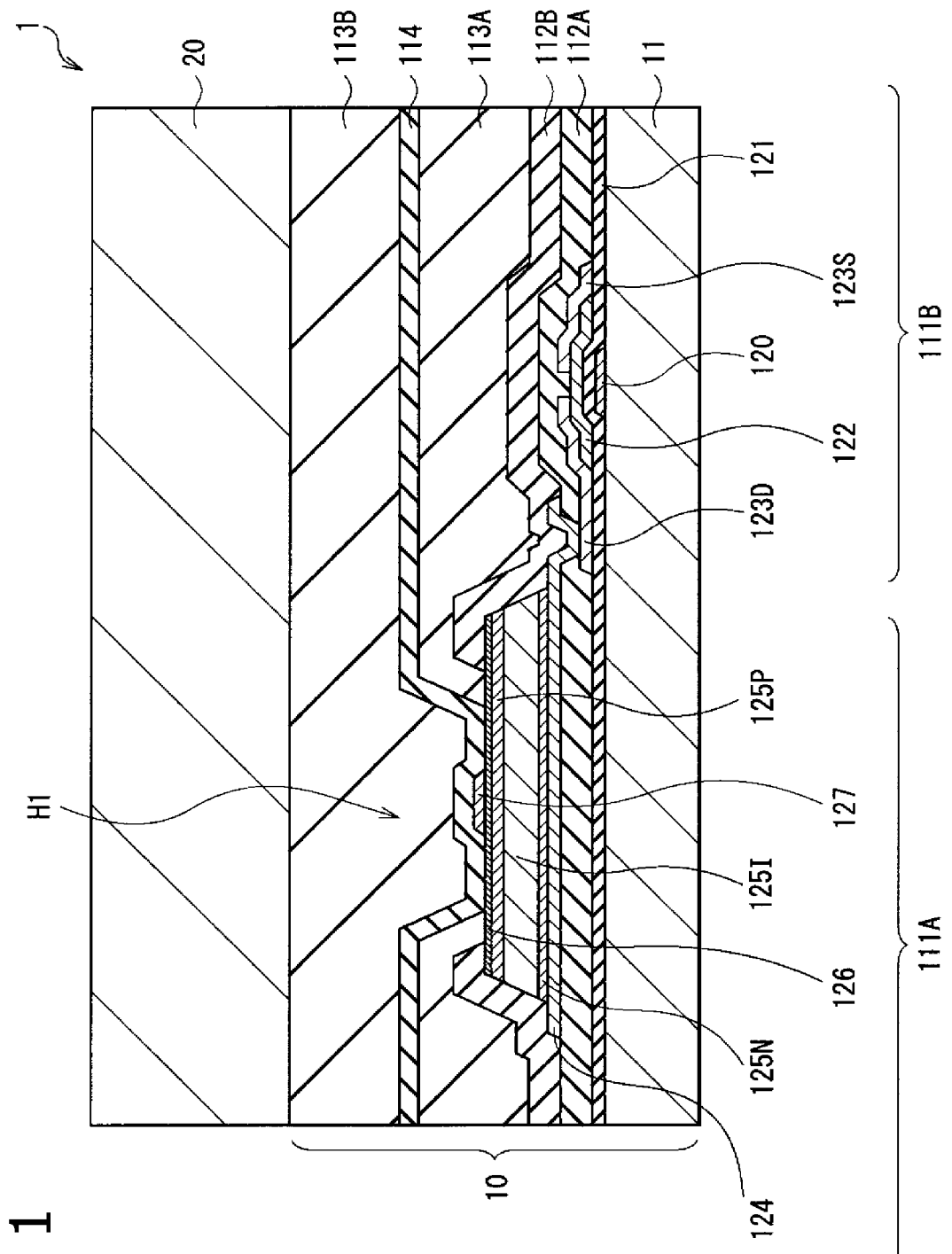
FIG. 1 is a cross sectional view showing a structure of a radiation image pickup device as an image pickup device according to a first embodiment of the present disclosure.

FIG. 1 is a cross sectional view showing a cross-sectional structure of an image pickup device (a radiation image pickup device 1) according to a first embodiment of the present disclosure. The radiation image pickup device 1 wavelength-converts a radiation represented by an α-ray, a β-ray, a γ-ray or an X-ray and receives the resulting radiation, thereby reading image information based on the radiation (capturing an image of a subject). The radiation image pickup device 1 is suitably used as an X-ray image pickup device for a non-destructive inspection such as a baggage inspection, including medical use.

The radiation image pickup device 1 is such that a wavelength converting member 20 which will be described later is disposed on a sensor substrate 10. The sensor substrate 10 and the wavelength converting member 20 are previously made as different modules, correspondingly.

The sensor substrate 10 includes plural pixels (unit pixels P which will be described later). The sensor substrate 10 is such that a pixel circuit including plural photodiodes 111A (photoelectric conversion elements), and Thin Film Transistors (TFTs) 111B as driving elements for the photodiodes 111A is formed on a substrate 11. In the first embodiment of the present disclosure, the photodiodes 111A and the thin film transistors 111B are disposed in parallel relation to each other on the substrate 11 made of a glass or the like. Also, parts (a gate insulating film 121, a first interlayer insulating film 112A, and a second interlayer insulating film 112B) of the photodiodes 111A and the thin film transistors 111B become a mutually common layer.

The gate insulating film 121 is provided on the substrate 11. In this case, the gate insulating film 121 is composed of either a single layer film composed of one kind of film, for example, selected from a silicon oxide ($SiO_2$) film, a silicon oxynitride (SiON) film, and a silicon nitride (SiN) film, or a lamination film composed of two or more kinds of films selected from those films.

The first interlayer insulating film 112A is provided on the gate insulating film 121 and is composed of an insulating film such as a silicon oxide film or a silicon nitride film. The first interlayer insulating film 112A functions as a protective film (passivation film) as well covers the thin film transistor 111B which will be described later. It is noted that the first interlayer insulating film 112A corresponds to a concrete example of "an interlayer insulating film" in an embodiment of the present disclosure.

(Photodiode 111A)

The photodiode 111A is a photoelectric conversion element for generating electric charges (optical electric charges) having a quantity of electric charges corresponding to a quantity of incident light (quantity of received light) to accumulate the electric charges thus generated in the inside thereof. The photodiode 111A, for example, is composed of a Positive Intrinsic Negative (PIN) photodiode. In the photodiode 111A, a sensitivity range thereof, for example, is set to a visible range (a wavelength range of a received light is the visible range). The photodiode 111A, for example, is disposed in a selective area on the substrate 11 through both of the gate insulating film 121 and the first interlayer insulating film 112A.

Specifically, in the photodiode 111A, a lower electrode 124, an n-type semiconductor layer 125N, an i-type semiconductor layer 125I, a p-type semiconductor layer 125P, and an upper electrode 126 are laminated in this order on the first interlayer insulating film 112A. Of them, the n-type semiconductor layer 125N, the i-type semiconductor layer 125I, and the p-type semiconductor layer 125P correspond to a concrete example of "a photoelectric conversion layer" in an embodiment of the present disclosure. Note that, in the first embodiment, there is given the case where the n-type semiconductor layer 125N is provided on the substrate side (on a lower portion side), and the p-type semiconductor layer 125P is provided on the upper portion side. However, there may be adopted a structure reverse to this structure, that is, a structure in which the p-type semiconductor layer is provided on the lower portion side (on the substrate side), and the n-type semiconductor layer is provided on the upper portion side.

The lower electrode 124 is an electrode through which signal electric charges are read out from the photoelectric conversion layer (including the n-type semiconductor layer 125N, the i-type semiconductor layer 125I, and the p-type semiconductor layer 125P). Thus, in this case, the lower electrode 124 is connected to a drain electrode 123D which will be described later in the thin film transistor 111B. Such a lower electrode 124, for example, is composed of a three-layer structure ((Mo/Al/Mo) or the like) which is obtained through lamination of molybdenum (Mo), aluminum (Al), titanium (Ti), tungsten (W), a chromium (Cr), molybdenum or the like.

The n-type semiconductor layer 125N, for example, is made of amorphous silicon (a-Si) and forms an $n^+$-type region. A thickness of the n-type semiconductor layer 125N, for example, is in the range of about 10 to about 50 nm.

The i-type semiconductor layer 125I is a semiconductor layer whose conductivity is lower than that of each of the n-type semiconductor layer 125N and the p-type semiconductor layer 125P, for example, a non-doped intrinsic semiconductor layer and, for example, is a made of amorphous silicon (a-Si). Although a thickness of the i-type semiconductor layer 125I, for example, is in the range of about 400 to about 1,000 nm, an optical sensitivity can be increased as the thickness of the i-type semiconductor layer 125I is larger.

The p-type semiconductor layer 125P, for example, is made of amorphous silicon (a-Si), and forms a $p^+$-type region. A thickness of the p-type semiconductor layer 125P, for example, is in the range of about 10 to about 50 nm.

The upper electrode 126, for example, is an electrode through which a reference electric potential (bias electric potential) during the photoelectric conversion is supplied to the photoelectric conversion layer previously described. Thus, the upper electrode 126 is connected to a wiring layer 127 as a power source wiring for supply of the reference electric potential. The upper electrode 126, for example, is composed of a transparent conductive film such as an Indium Tin Oxide (ITO) film.

(Thin Film Transistor 111B)

The thin film transistor 111B, for example, is composed of a Field-Effect Transistor (FET). In the thin film transistor 111B, a gate electrode 120, for example, made of titanium (Ti), Al, Mo, tungsten (W), chromium (Cr) or the like is formed on the substrate 11 and the gate insulating film 121 described above is formed so as to cover the gate electrode 120.

A semiconductor layer 122 is formed on the gate insulating film 121. Also, the semiconductor layer 122 includes a channel region. The semiconductor layer 122, for example, is made of polycrystalline silicon, microcrystalline silicon or amorphous silicon. Or, the semiconductor layer 122 is made of a semiconductor oxide such as an indium gallium zinc oxide (InGaZnO) or a zinc oxide (ZnO).

A source electrode 123S and the drain electrode 123D which are connected to a signal line for read, and various kinds of wirings are formed on such a semiconductor layer 122. Specifically, in this case, the drain electrode 123D is connected to the lower electrode 124 in the photodiode 111A. Also, the source electrode 123S is connected to a vertical signal line 18 (source line) which will be described later. Each of the source electrode 123S and the drain electrode 123D, for example, is made of Ti, Al, Mo, W, Cr or the like.

In addition, in the sensor substrate 10, the second interlayer insulating film 112B, a first planarizing film 113A, a protective film 114, and a second planarizing film 113B are provided in this order on an upper layer of each of the photodiode 111A and the thin film transistor 111B.

The second interlayer insulating film 112B is provided so as to cover the thin film transistor 111B, and a side surface, and an end portion of an upper surface (the upper electrode 126) in the photodiode 111A. The second interlayer insulating film 112B, for example, is composed of an insulating film such as a silicon oxide film or a silicon nitride film.

The first planarizing film 113A is disposed on an upper layer side of each of the photodiode 111A and the thin film transistor 111B. The first planarizing film 113A, for example, is made of a transparent resin material such as polyimide. A thickness of the first planarizing film 113A, for example, is equal to or smaller than about 3 μm in a portion (flat portion) except for a region in which the photodiode 111A is formed. An opening portion H1 is formed in the first planarizing film 113A so as to correspond to the vicinity of the region in which the photodiode 111A is formed. A side surface of the opening portion H1 has a taper-like shape and is disposed on the upper electrode 126 of the photodiode 111A.

The protective film 114 is provided over the entire surface of the upper electrode 126, the wiring layer 127, and the first planarizing film 113A. The protective film 114, for example, is composed of an insulating film such as a silicon oxide film or a silicon nitride film.

The second planarizing film 113B is provided over the entire surface of the protective film 114 and, for example, is made of a transparent resin material such as polyimide.
(Wavelength Converting Member 20)

The wavelength converting member 20, as described above, is made as a module different from the sensor substrate 10 and, for example, is composed of a scintillator plate (scintillator panel) or the like. In a word, the wavelength converting member 20 is a flat plate-like (plate-like) member. The wavelength converting member 20, for example, is made such that a scintillator layer (wavelength converting layer) is provided on a transparent substrate made of a glass or the like. A protective film having a moisture-proof property may be further formed on the scintillator layer or a protective film may be provided so as to cover the entire surface of the scintillator layer and a substrate.

A scintillator (phosphor) for converting a radiation (X-ray) into a visible light, for example, is used in such a wavelength converting member 20. In other words, the wavelength converting member 20 has a function of wavelength-converting a radiation (X-ray) made incident thereto from the outside into a light having a wavelength in a sensitivity range (visible range) of the photoelectric conversion element 111A. Such a phosphor, for example, includes a phosphor material obtained by adding thallium (Tl) to a cesium iodide (CsI) (CsI;Tl), a phosphor material obtained by adding terbium (Tb) to a gadolinium oxidized sulfur ($Gd_2O_2S$), BaFX (X is Cl, Br, I or the like), and the like. A thickness of the scintillator layer is preferably in the range of 100 to 600 μm. For example, when CsI;Tl is used as the phosphor material, the thickness thereof, for example, is 600 μm. It is noted that the scintillator layer can be deposited on a transparent substrate by, for example, utilizing a vacuum evaporation method. In this case, the scintillator plate as described above is exemplified as the wavelength converting member 20. However, all it takes is a wavelength converting member which can wavelength-convert a radiation into a light having a wavelength in a sensitivity range of the photodiode 111A, and thus the wavelength converting member is especially by no means limited to the materials described above.

[Detailed Configuration of Sensor Substrate 10]

Figure 2:
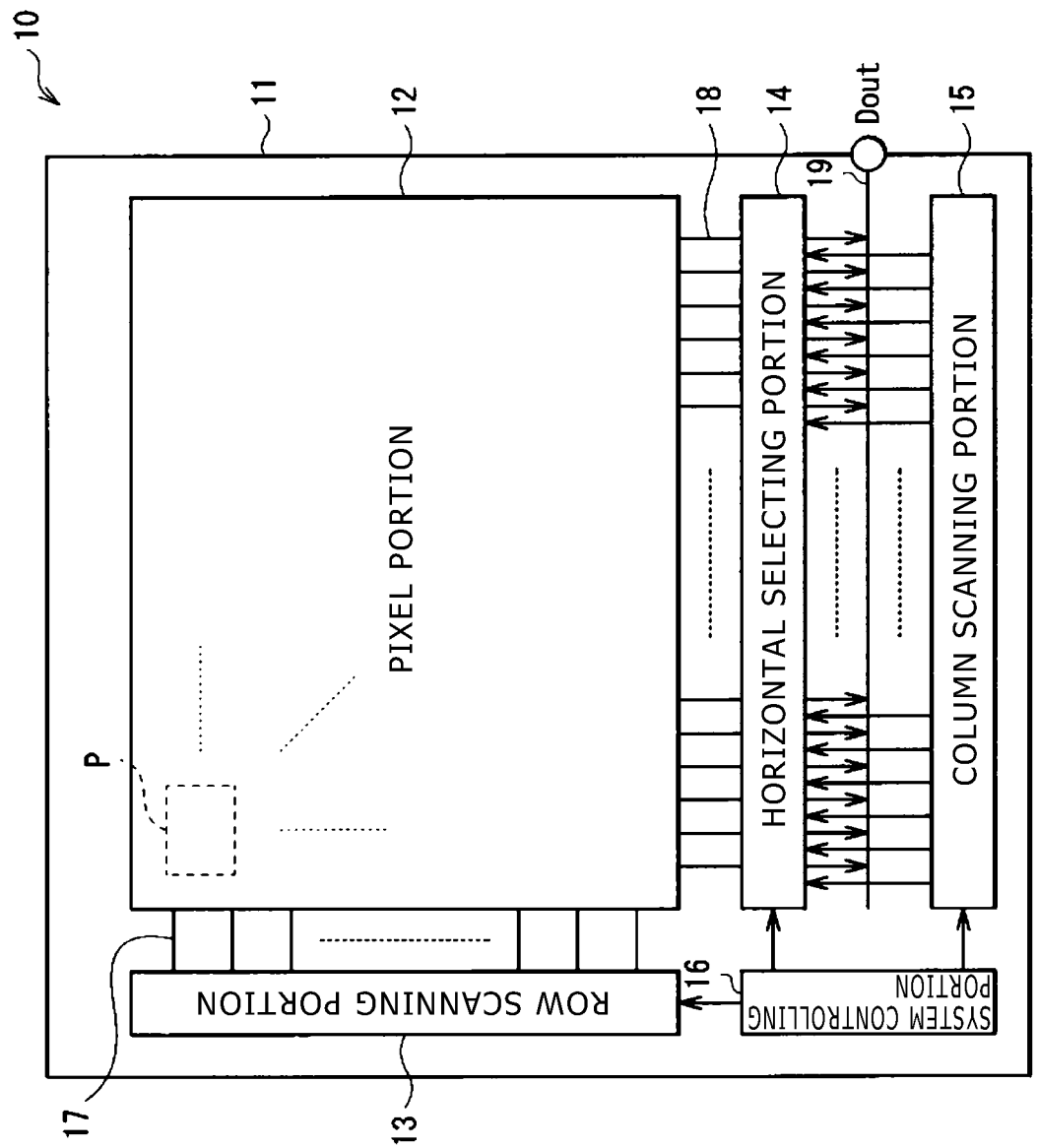
FIG. 2 is a block diagram showing a configuration of a sensor substrate shown in FIG. 1.

FIG. 2 is a functional block diagram showing an entire configuration of the sensor substrate 10 as described above. The sensor substrate 10 includes a pixel portion 12 serving as an image capturing area (image capturing portion), and includes a peripheral circuit (drive circuit), for example, composed of a row scanning portion 13, a horizontal selecting portion 14, a column scanning portion 15, and a system controlling portion 16 in a peripheral area of the pixel portion 12.
(Pixel Portion 12)

The pixel portion 12 includes unit pixels P (hereinafter simply described as "pixels" in some cases) which, for example, are two-dimensionally disposed in a matrix. Each of the unit pixels P includes the photodiode 111A and the thin film transistor 111B which have been described above. In the unit pixel P, for example, a pixel driving line 17 (for example, a row selecting line and a reset controlling line, and the like: a gate line) is wired every pixel row, and a vertical signal line 18 (source line) is wired every pixel column. The pixel driving line 17 is used to transmit a drive signal in accordance with which signals are read out from corresponding ones of the unit pixels P. One ends of the pixel driving lines 17 are connected to output ends corresponding to the rows of the row scanning portion 13. On the other hand, the vertical signal line 18 is used to read out the image pickup signal from the photodiode 111A within the unit pixel P through the thin film transistor 111B. It is noted that the vertical signal lines 18 correspond to a concrete example of "a wiring" and "a signal line" in an embodiment of the present disclosure.

Figure 3:
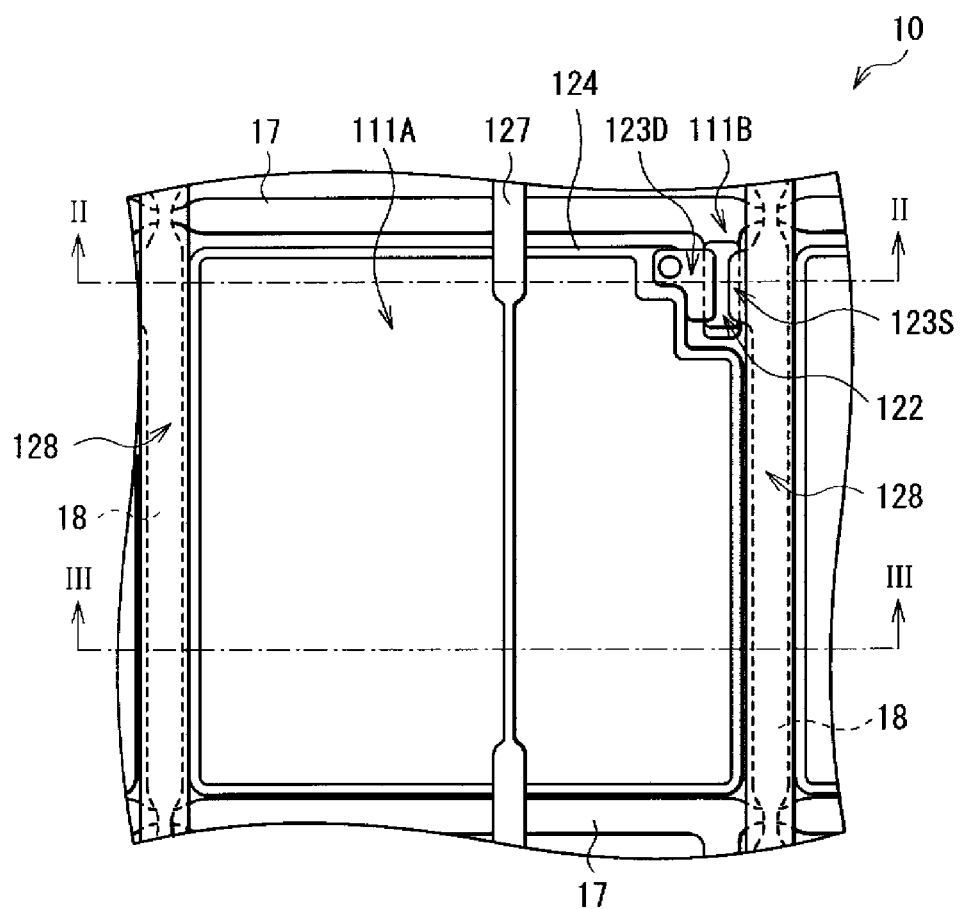
FIG. 3 is a top plan view showing a structure of the sensor substrate shown in FIG. 1.

Here, FIG. 3 shows a planar structure of the unit pixel P in the sensor substrate 10 (the pixel portion 12). As shown in FIG. 3, in the unit pixel P, the drain electrode 123D in the thin film transistor 111B (driving element) is connected to the lower electrode 124 in the photodiode 111A, and the source electrode 123S in the thin film transistor 111B is connected to the vertical signal line 18. That is to say, the vertical signal line 18 is electrically connected to the thin film transistor 111B. It is noted that a cross-sectional structure taken on a line II-II shown in FIG. 3 corresponds to the cross-sectional structure of the sensor substrate 10 shown in FIG. 1.

Figure 4:
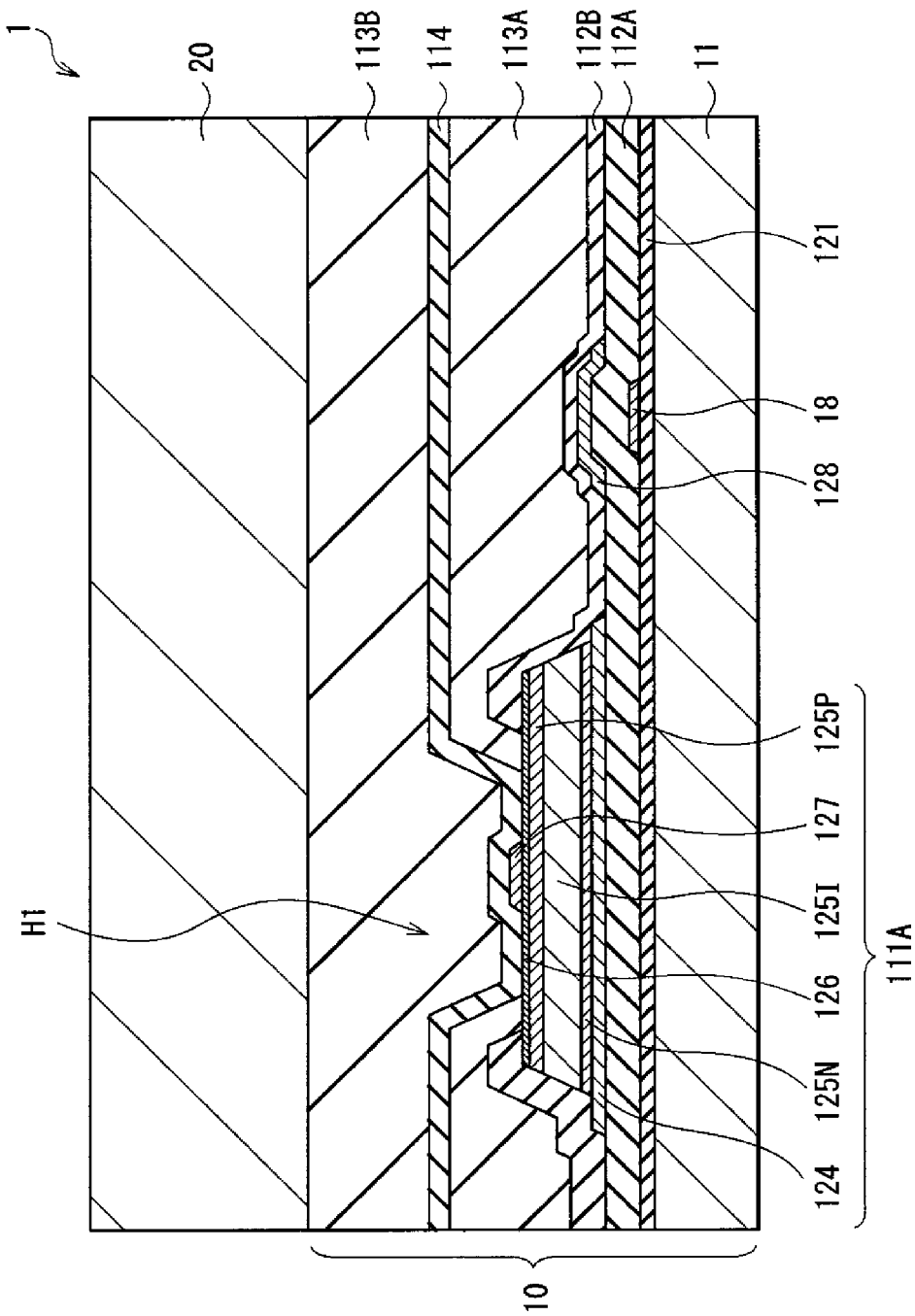
FIG. 4 is a cross sectional view taken on line III-III of FIG. 3.

On the other hand, FIG. 4 shows a cross-sectional structure of the sensor substrate 10 taken on a line III-III shown in FIG. 3. Although the cross-sectional structure shown in FIG. 4 is basically the same as that shown in FIG. 1, the vertical signal line 18 is formed on the substrate 11 instead of forming the thin film transistor 111B. Specifically, the vertical signal line 18 is provided in a selective region (corresponding to the region in which the thin film transistor 111B is formed in FIG. 1) between the gate insulating film 121 and the first interlayer insulating film 112A.

Here, in the first embodiment of the present disclosure, as shown in FIGS. 3 and 4, a shield electrode 128 is provided in a region between the photodiode 111A and the vertical signal line 18 in a layer (a layer different from a formation layer of the vertical signal line 18) different from that of the vertical signal line 18. In this case, the shield electrode 128 is formed on the upper layer side with respect to the vertical signal line 18 (specifically, in the same layer as that of the lower electrode 124 of the photodiode 111A) so as to extend along the vertical signal line 18. In other words, in this case, there is adopted the structure in which the first interlayer insulating film 112A is formed between the formation layer of the shield electrode 128 and the lower electrode 124, and the layer of the vertical signal line 18. In addition, a predetermined reference electric potential (for example, an electric potential used to read out the image pickup signal from the pixel) is applied to the shield electrode 128 which in turn has a fixed electric potential applied thereto. As will be described later, such a shield electrode 128, for example, is made of the same material (for example, composed of the three layer structure (Mo/Al/Mo) obtained by laminating an Mo layer, an Al layer, and an Mo layer) as that of the lower electrode 124 in the same process as that for the lower electrode 124.

(Peripheral Circuit)

The row scanning portion 13 shown in FIG. 2 is a pixel driving portion which is composed of a shift register, an address decoder, and the like and, for example, drives the pixels P of the pixel portion 12 in rows. Signals (image pickup signals) outputted from the pixels P belonging to the pixel row which is selected and scanned by the row scanning portion 13 are supplied to the horizontal selecting portion 14 through vertical signal lines 18, correspondingly.

The horizontal selecting portion 14 is composed of an amplifier, a horizontal selecting switch, and the like which are provided every vertical signal line 18.

The column scanning portion 15 is composed of a shift register, an address decoder, and the like, and operates to drive the horizontal selecting switches of the horizontal selecting portion 14 one after another while it scans the horizontal selecting switches of the horizontal selecting portion 14. In accordance with the selection scanning by the column scanning portion 15, the signals which are transmitted from the pixels P through the respective vertical signal lines 18 are outputted to a horizontal signal line 19 one after another to be transmitted to the outside of the substrate 11 through the horizontal signal line 19 concerned.

It is noted that the circuit portion composed of the row scanning portion 13, the horizontal selecting portion 14, the column scanning portion 15, and the horizontal signal line 19 either may be formed directly on the substrate 11 or may be one which is disposed in an external control Integrated Circuit (IC). In addition, such circuit portions may also be formed on another substrate which is connected to the substrate 11 through a cable or the like.

The system controlling portion 16 receives a clock signal which is supplied thereto from the outside of the substrate 11, data which is used to command an operation mode, and the like, and outputs data such as internal information of the radiation image pickup device 1. The system controlling portion 16 further includes a timing generator for generating various kinds of timing signals. Thus, the system controlling portion 16 carries out drive control for the peripheral circuit composed of the row scanning portion 13, the horizontal selecting portion 14, the column scanning portion 15, and the like in accordance with the various kinds of timing signals generated by the timing generator.

[Method of Manufacturing Image Pickup Device 1]

The radiation image pickup device 1 as described above, for example, can be manufactured as follows. FIGS. 5A to 5G are correspondingly cross sectional views explaining processes in a method of manufacturing the radiation image pickup device 1 (especially, a method of manufacturing the sensor substrate 10).

Figure 5A:
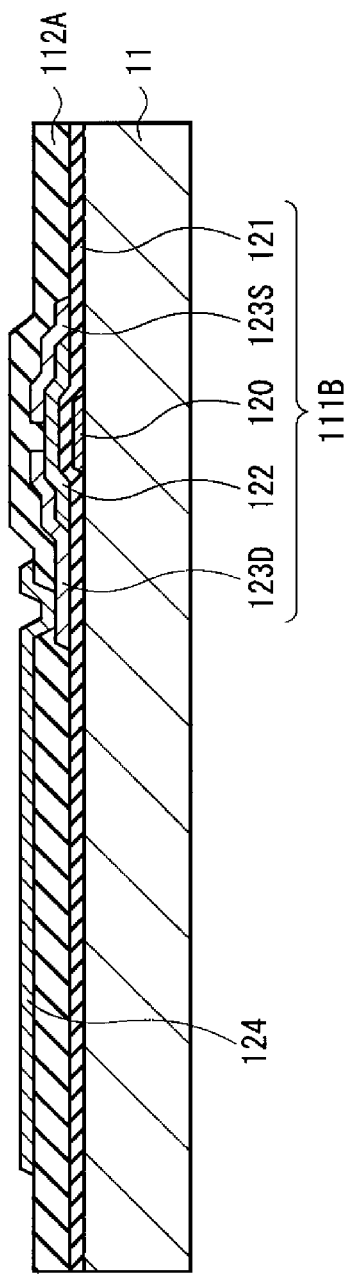

Firstly, the sensor substrate 10 is manufactured. Specifically, as shown in FIG. 5A, the thin film transistor 111B is formed on the substrate 11, for example, made of a glass by utilizing the known thin film process. Subsequently, the first interlayer film 112A made of the insulating material described above is formed on the thin film transistor 111B by, for example, utilizing a Chemical Vapor Deposition (CVD) method and a photolithography method. After that, the lower electrode 124 made of the conductive material described above is formed so as to be electrically connected to the drain electrode 123D in the thin film transistor 111B by, for example, utilizing a sputtering method and the photolithography method.

Figure 5B:
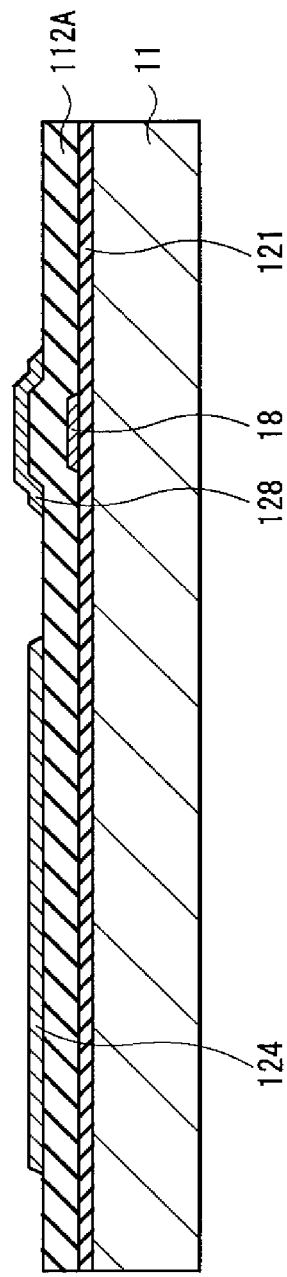

In addition, at this time, as shown in FIG. 5B, the vertical signal line 18, for example, is formed of the same material as that of each of the source electrode 123S and the drain electrode 123D in the thin film transistor 111B in the same process as that in each of the source electrode 123S and the drain electrode 123D in the thin film transistor 111B. In addition, the shield electrode 128, for example, is formed of the same material as that of the lower electrode 124 in the photodiode 111A in the same process as that in the lower electrode 124 in the photodiode 111A. As a result, the shield electrode 128 which is located in the region between the photodiode 111A and the vertical signal line 18 is formed in the layer different from that of the signal line 18, that is, in the same layer as that of the lower electrode 124 in this case.

Figure 5C:
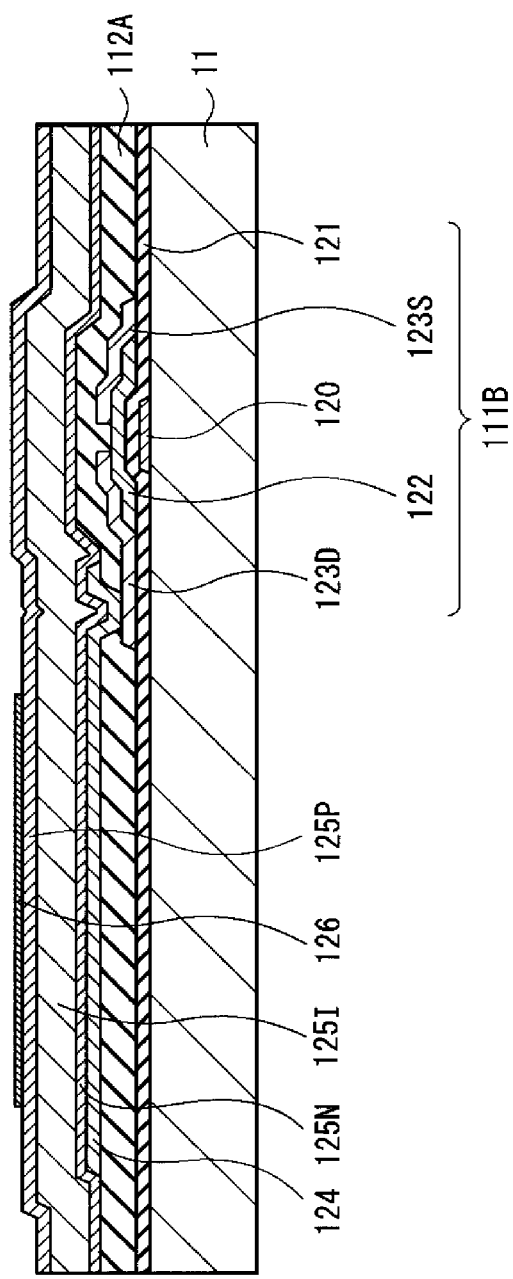

Next, as shown in FIG. 5C, the n-type semiconductor layer 125N, the i-type semiconductor layer 125I, and the p-type semiconductor layer 125P which are made of the materials described above, correspondingly, by, for example, utilizing the CVD method. After that, the upper electrode 126 made of the conductive material described above is formed in a region in which the photodiode 111A is intended to be formed on the p-type semiconductor layer 125P by, for example, utilizing the sputtering method and the photolithography method.

Figure 5D:
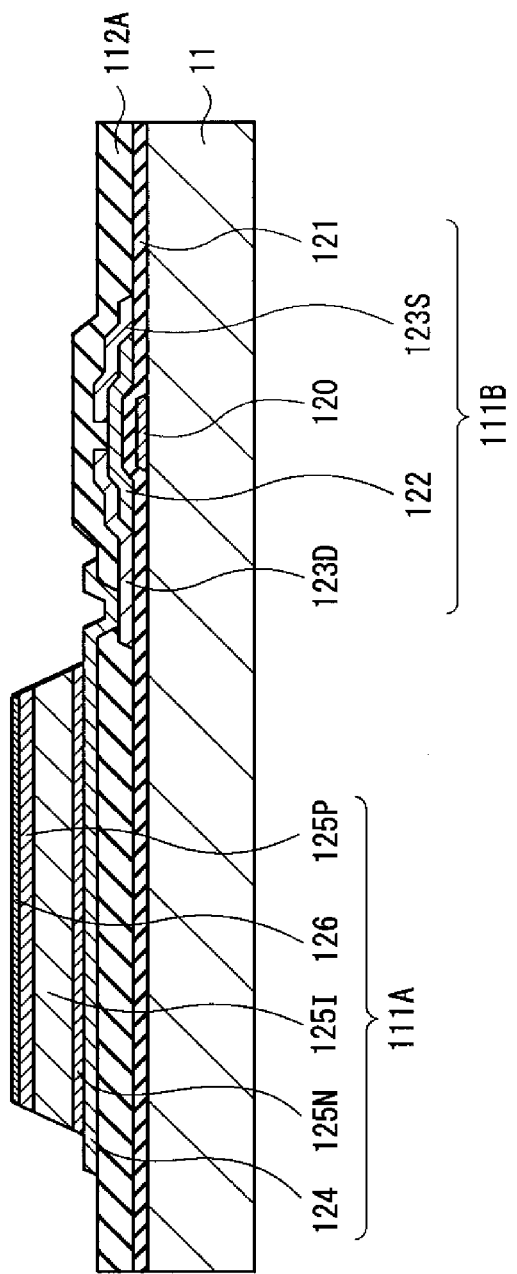

Subsequently, as shown in FIG. 5D, the lamination structure of the n-type semiconductor layer 125N, the i-type semiconductor layer 125I, and the p-type semiconductor layer 125P which were formed in the manner as described above is patterned into a predetermined shape by, for example, utilizing the photolithography method and a dry etching method. As a result, the photodiode 111A is formed on the substrate 11.

Next, as shown in FIG. 5E, the second interlayer insulating film 112B made of the insulating material described above is formed so as to cover the thin film transistor 111B, and the side surface and the end portion of the upper surface (the upper electrode 126) in the photodiode 111A by, for example, utilizing the CVD method and the photolithography method. After that, the entire surface of the second interlayer insulating film 112B (the upper layer side of the photodiode 111A and the thin film transistor 111B) is coated with the first planarizing film 113A made of the material described above. Also, the opening portion H1 is formed so as to correspond to the formation area of the photodiode 111A in the first planarizing film 113A by, for example, utilizing the photolithography method.

Figure 5F:
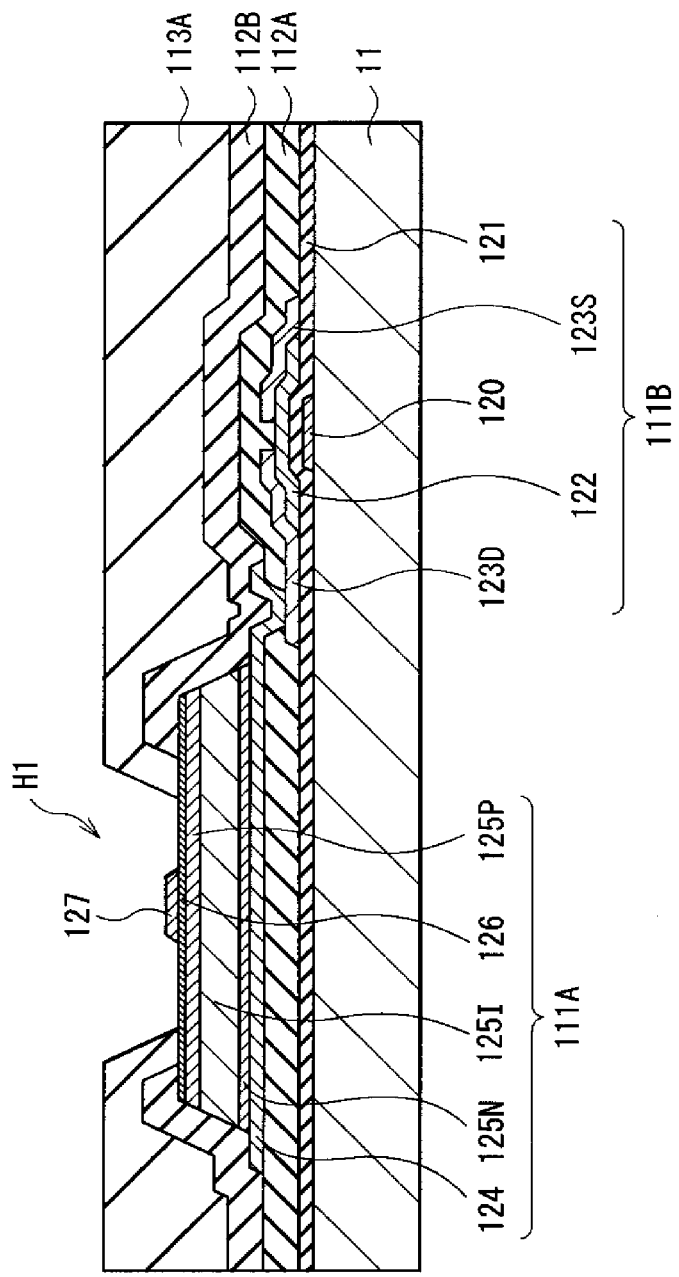

Subsequently, as shown in FIG. 5F, the wiring layer 127, for example, made of Al, Mo, Cu or the like is formed within the opening portion H1 (on the upper electrode 126) in the first planarizing film 113A by, for example, utilizing the sputtering method and the photolithography method.

Figure 5G:
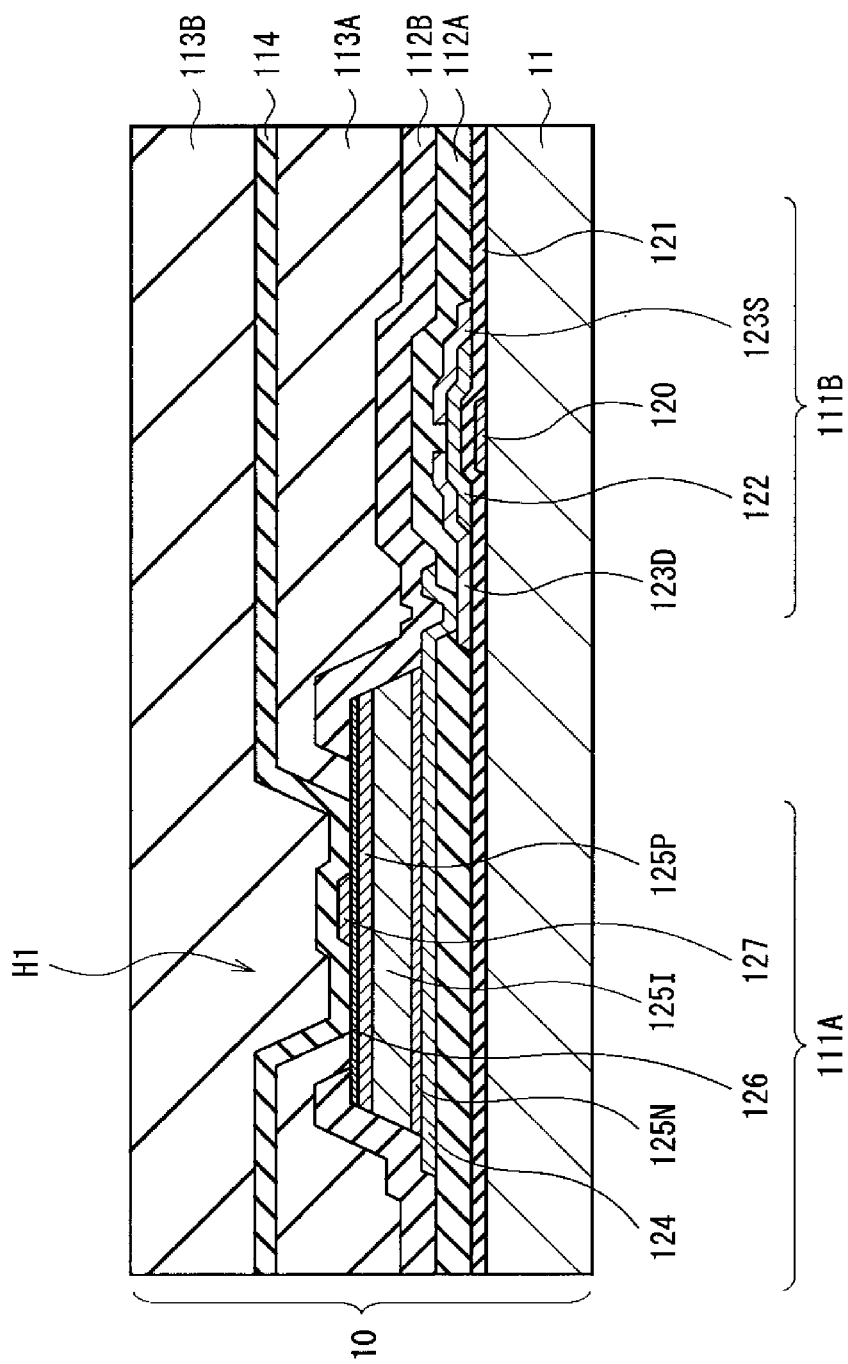

After that, as shown in FIG. 5G, the protective film 114 made of the material described above is deposited over the entire surface of the first planarizing film 113A, the upper electrode 126, and the wiring layer 127 by, for example, utilizing the CVD method. Also, the second planarizing film 113B is formed over the entire surface of the protective film 114 by, for example, utilizing the photolithography method. As a result, the sensor substrate 10 shown in FIG. 1 is completed.

Finally, the wavelength converting member 20 which was specially made by utilizing the method described above is stuck to the sensor substrate 10 (for example, the wavelength converting member 20 is bonded to the peripheral area of the pixel portion 12 by using a sealing material, or either the periphery of the pixel portion 12 or the panel entire surface is pressed to be fixed). As a result, the radiation image pickup device 1 shown in FIG. 1 is completed.

[Operation and Effects of Image Pickup Device 1]
(1. Image Capturing Operation)

An operation and effects of the radiation image pickup device 1 of the first embodiment will now be described. When the radiation which, for example, has been irradiated from a radiation irradiating source (not shown) (for example, an X-ray irradiating source) to be transmitted through a subject (a body to be detected) is made incident to the radiation image pickup device 1, the radiation thus made incident thereto is subjected to the photoelectric conversion after having been subjected to the wavelength conversion, and thus an image of the subject is obtained in the form of an electrical signal (image pickup signal). Specifically, the radiation which has been made incident to the radiation image pickup device 1 is firstly converted into the light having the wavelength in the sensitivity range (in the visible range in this case) of the photodiode 111A in the wavelength converting member 20 (the visible light is emitted from the wavelength converting member 20). The visible light which has been emitted from the wavelength converting member 20 in such a manner is made incident to the sensor substrate 10.

When in the sensor substrate 10, a predetermined electric potential (bias electric potential) is applied to one end (for example, the upper electrode 126) of the photodiode 111A through the wiring 127, the light made incident from the side of the upper electrode 126 is converted into the signal electric charges having a quantity of electric charges corresponding to the quantity of received light (that light is subjected to the photoelectric conversion). The signal electric charges generated through the photoelectric conversion are taken out in the form of a photo current from the other end (for example, the lower electrode 124) side of the photodiode 111A.

Specifically, the electric charges generated through the photoelectric conversion in the photodiode 111A are read out in the form of a photo current, and are outputted in the form of the image pickup signal from the thin film transistor 111B. The image pickup signal thus outputted from the thin film transistor 111B is outputted (read out) to corresponding one of the vertical signal lines 18 in response to the row scanning signal which is transmitted from the row scanning portion 13 through corresponding one of the pixel driving lines 17. The image pickup signals outputted to the respective vertical signal lines 18 are outputted to the horizontal selecting portion 14 through the respective vertical signal lines 18 every pixel column. Also, the image pickup signals from the respective pixels which have been transmitted through the respective vertical signal lines 18 in accordance with the selection scanning made by the column scanning portion 15 are outputted to the horizontal signal line 19 one after another. Also, the image pickup signals are then transmitted to the outside of the substrate 11 through the horizontal signal line 19 (output data Dout is outputted to the outside). In the manner as described above, the captured image is obtained in the radiation image pickup device 1 by using the radiation.

(2. Operation of Shield Electrode 128)

Here, an operation of the shield electrode 128 in the radiation image pickup device 1 of the first embodiment will be described in detail with reference to FIGS. 3, 4, and 6 while it is compared with a comparative example for the radiation image pickup device 1 of the first embodiment.

(Comparative Example)

FIG. 6 shows a cross-sectional structure of a radiation image pickup device (a radiation image pickup device 100) according to the comparative example for the radiation image pickup device 1 of the first embodiment. The radiation image pickup device 100 of the comparative example is such that in the radiation image pickup device 1 of the first embodiment shown in FIG. 4, a sensor substrate 101 not having such a shield electrode 128 is provided instead of providing the sensor substrate 10 having the shield electrode 128 described above.

Since in the radiation image pickup device 100, as described above, in the sensor substrate 101, the shield electrode 128 is not provided in the region between the photodiode 111A and the vertical signal line 18, the image quality of the captured image is deteriorated from the following reason.

That is to say, firstly, for example, as schematically shown in FIG. 6, a large coupling capacitance C101 is formed between the photodiode 111A (specially, the lower electrode 124) and the vertical signal line 18. Also, a noise component in the image pickup signal (the signal which is read out from the photodiode 111A through the thin film transistor 111B) is increased due to the formation of the large coupling capacitance C101. As a result, a Signal to Noise (S/N) ratio in the image pickup signal is reduced, which leads to the deterioration of the image quality of the captured image.

(First Embodiment)

On the other hand, in the radiation image pickup device 1 of the first embodiment, as shown in FIGS. 3 and 4, the shield electrode 128 is provided in the region between the photodiode 111A and the vertical signal line 18 within the sensor substrate 10. As a result, as compared with the case of the comparative example described above in which such a shield electrode 128 is not provided, the coupling capacitance formed between the photodiode 111A (specially, the lower electrode 124) and the vertical signal line 18 becomes small. Thus, the noise component in the image pickup signal which is transmitted on the vertical signal line 18 is reduced. Specifically, in this case, since the predetermined reference electric potential (for example, the read electric potential) is applied to the shield electrode 128, the capacitance change in the coupling capacitance is suppressed, which contributes to the reduction of the noise component. The noise component in the image pickup signal is reduced in such a manner and as a result, as compared with the comparative example described above, the S/N ratio is improved and thus, the image quality of the captured image is enhanced.

In addition, such a shield electrode 128 is formed in the layer different from that of the vertical signal line 18. As a result, as compared with the case where the shield electrode 128, for example, is formed in the same layer as that of the vertical signal line 18, the effective utilization of the region (space) is realized and an aperture ratio (a rate of the area of the information area of the photodiode 111A) is prevented from lowering. In addition thereto, in this case, the shield electrode 128 is formed in the same layer as that of the lower electrode 124 of the photodiode 111A (the shield electrode 128 is formed of the same material as that of the lower electrode 124 in the same process as that of the lower electrode 124). Therefore, the shield electrode 128 can be formed without increasing the number of processes during the manufacture and thus an increase in the manufacturing cost is avoided.

In the first embodiment of the present disclosure, the shield electrode 128 formed in the region between the photodiode 111A and the vertical signal line 18 in the layer different from that of the vertical signal line 18 electrically connected to the driving element (thin film transistor 111B) for the photodiode 111A can reduce the noise component in the image pickup signal while realizing an effective utilization of the region. As a result, it is possible to enhance the image quality of the captured image while the device (the sensor substrate 10 and the radiation imaging pickup device 1) is miniaturized.

2. Modified Change

Subsequently, a modified change of the first embodiment of the present disclosure will be described with reference to FIG. 7. It is noted that in the modified change of the first embodiment, the same constituent elements as those in the first embodiment are designated by the same reference numerals or symbols, correspondingly, and a repeated description is suitably omitted here for the sake of simplicity.

Figure 7:
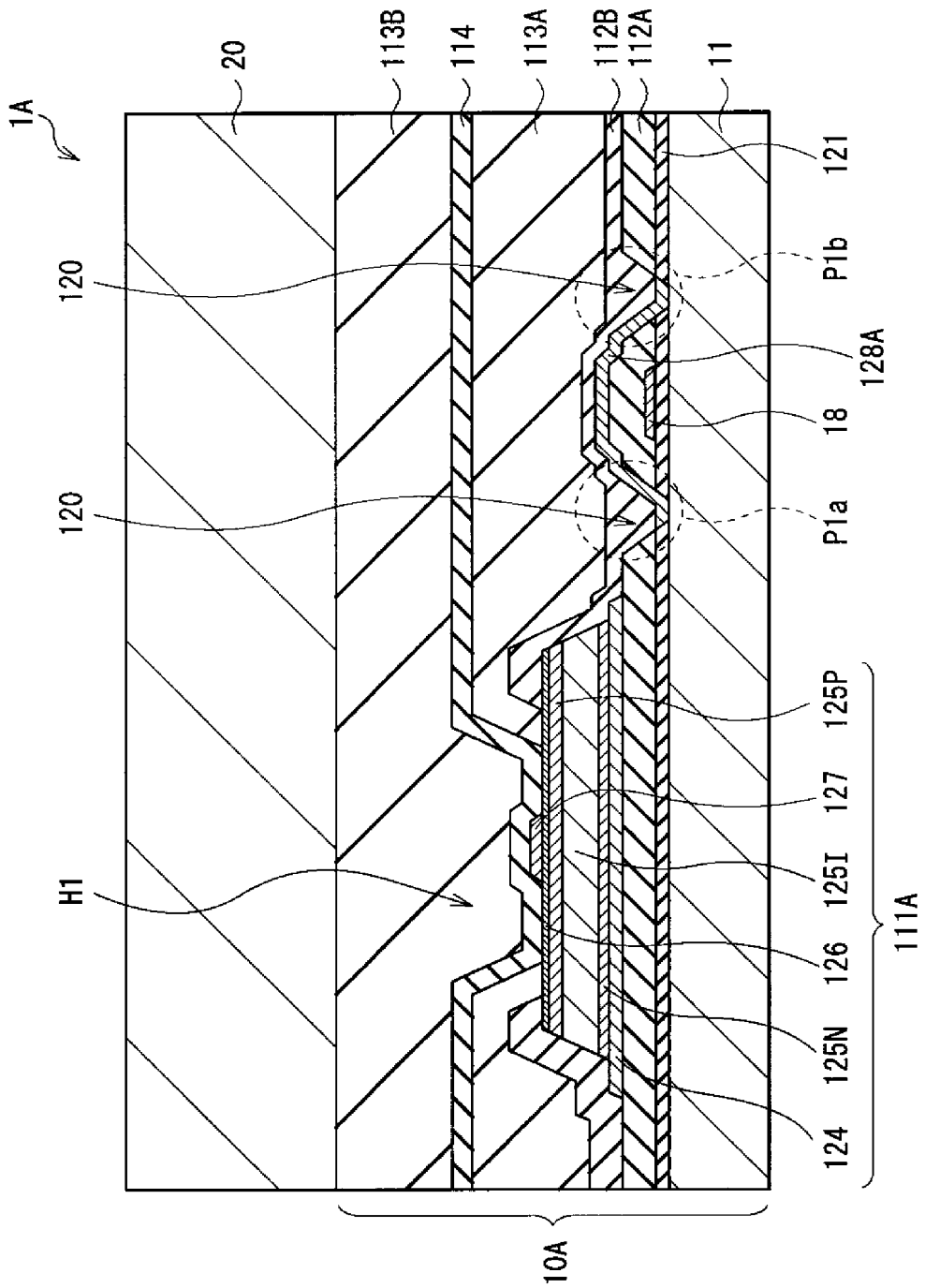
FIG. 7 is a cross sectional view showing a structure of a radiation image pickup device according to a modified change of the first embodiment of the present disclosure.

FIG. 7 is a cross sectional view showing a cross-sectional structure of an image pickup device (radiation image pickup device 1A) according to the modified change of the first embodiment. The radiation image pickup device 1A according to the modified change of the first embodiment is such that a sensor substrate 10A which will be described below is provided instead of providing the sensor substrate 10 in the radiation image pickup device 1 of the first embodiment.

Although the sensor substrate 10A basically has the same structure as that of the sensor substrate 10 in the first embodiment, a structure (shape) of a shield electrode 128A which will be described below is different from that of the shield electrode 128 in the sensor substrate 10.

That is to say, in the sensor substrate 10A, the shield electrode 128A is formed so as to cover the circumference of the vertical signal line 18 (so as to cover the side surface as well in addition to the upper layer side) through the first interlayer insulating film 112A. Specifically, in this case, as indicated by reference symbols Pla and Plb in FIG. 7, a pair of separation trenches 120 through which the vertical signal line 18 and the circumference thereof (an external region along a side surface direction of the vertical signal line 18) are separated (isolated) from each other is formed in the first interlayer insulating film 112A. Also, the shield electrode 128A is continuously formed so as to cover the first interlayer insulating film 112A and inner surfaces (side surfaces and bottom surfaces in this case) of the separation trenches 120 in the circumference of the vertical signal line 18.

As a result, in the modified change of the first embodiment, in addition to the effects inherent in the first embodiment, the following effect can also be obtained. That is to say, in the modified change of the first embodiment, the shield electrode 128A is formed so as to cover the circumference of the vertical signal line 18 through the first interlayer insulating film 112A. From this, as compared with the case (the first embodiment described above) of the shield electrode 128 formed only on the upper layer side of the vertical signal line 18, the coupling capacitance due to the wraparound from the side surface side of the vertical signal line 18 is reduced, thereby making it possible to increase the shield effect. Therefore, as compared with the case of the first embodiment, the coupling capacitance described above can be further reduced and thus the further reduction of the noise component in the image pickup signal (the further enhancement of the image quality of the captured image) becomes possible. In addition, even in the formation of such separation trenches 120, the number of processes is not increased because the separation trenches 120 are formed concurrently with the processes for forming a contact hole between the drain electrode 123D and the lower electrode 124. However, the formation of the separation trenches 120 results in reduction of the aperture ratio (the rate of the area of the formation area of the photodiode 111A).

3. Second Embodiment

Hereinafter, a radiation image pickup display system as an image pickup display system according to a second embodiment of the present disclosure will be described in detail with reference to FIG. 8.

Figure 8:
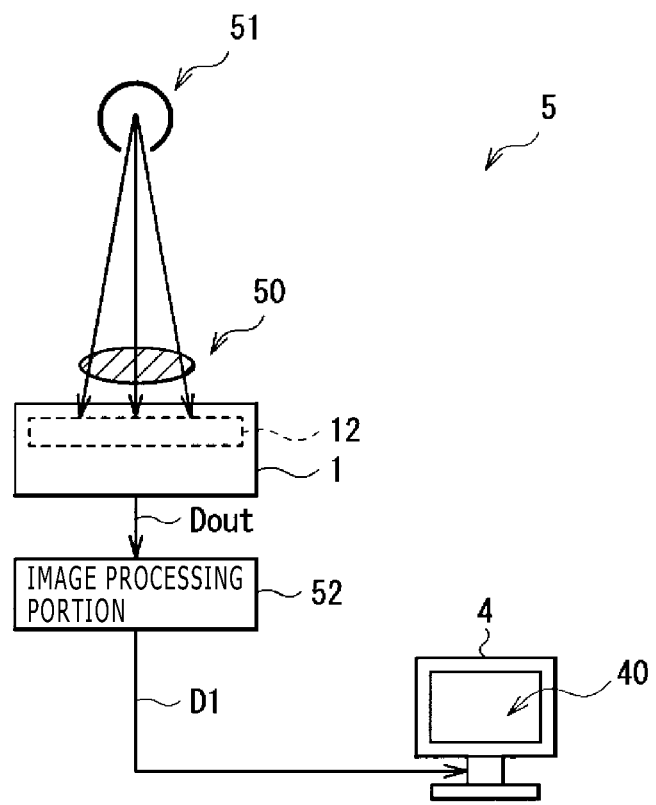
FIG. 8 is a block diagram showing a schematic configuration of a radiation image pickup system according to a second embodiment of the present disclosure.

FIG. 8 is a block diagram schematically showing a configuration of the radiation image pickup display system 5 as the image pickup display system according to the second embodiment of the present disclosure. The radiation image pickup display system 5 includes the radiation image pickup device 1 according to the first embodiment of the present disclosure, an image processing portion 52, and a display device 4, and thus is configured as the image pickup display system (radiation image pickup display system) using the radiation. In this case, as described above, the radiation image pickup device 1 according to the first embodiment of the present disclosure includes the sensor substrate 10 having the pixel portion 12.

The image processing portion 52 subjects output data Dout (image pickup signal) outputted from the radiation image pickup device 1 to predetermined image processing, thereby generating image data D1. The display device 4 displays an image based on the image data D1 generated in the image processing portion 52 on a predetermined monitoring screen 40.

In the radiation image pickup display system 5 having the configuration as described above, the radiation image pickup device 1 acquires the image data Dout on a subject 50 based on a radiated light (a radiation in this case) radiated from a light source (a radiation irradiating source 51 such as an X-ray irradiating source in this case) toward the subject 50, and outputs the image data Dout to the image processing portion 52. The image processing portion 52 subjects image data Dout thus inputted thereto to predetermined image processing and outputs the image data (display data) D1 after image processing to the display device 4. The display device 4 displays image information (on a captured image) on the monitor screen 40 based on the image data D1 thus inputted thereto.

In such a manner, in the radiation image pickup display system 5 of the second embodiment, the image of the subject 50 can be acquired in the form of an electrical signal in the radiation image pick device 1. Therefore, the electrical signal thus acquired is transmitted to the display device 4, thereby making it possible to display the image based on the electrical signal. That is to say, the image of the subject 50 can be observed without using the radiation photograph film like the related art, and the radiation image pickup display system 5 can respond to the moving image display as well as the moving image photographing.

It is noted that although the radiation image pickup display system 5 includes the radiation image pickup device 1 according to the first embodiment of the present disclosure, the radiation mage pickup display system 5 can also include the radiation image pickup device 1A according to the modified change of the first embodiment instead of including the radiation image pickup device 1 of the first embodiment.

4. Other Modified Changes

Although the technique of the present disclosure has been described by giving the first and second embodiments and the modified change of the first embodiment, the technique of the present disclosure is by no means limited to the first and second embodiments and the modified change of the first embodiment and thus other modified changes can be made.

For example, although the embodiments and the like have been described by exemplifying the case where the semiconductor layer in each of the photodiode 111A and the thin film transistor 111B is mainly made of the amorphous semiconductor (such as amorphous silicon), the present disclosure is by no means limited thereto. That is to say, the semiconductor layer described above, for example, may also be made of either a polycrystalline semiconductor (such as polycrystalline silicon) or a microcrystalline semiconductor (such as microcrystalline silicon).

In addition, although the embodiments and the like have been described by exemplifying the case where the shield electrode 128, 128A is formed in the same layer as that of the lower electrode 124 of the photodiode 111A, the present disclosure is by no means limited thereto. That is to say, the shield electrode may also be formed in another layer as long as the shield electrode is provided in the layer different from that of the wiring (the vertical signal line 18).

Figure 9:
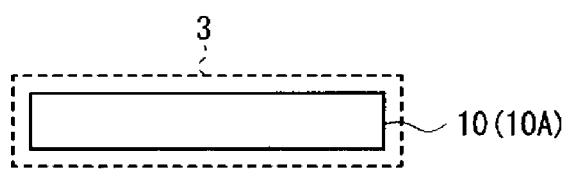
FIG. 9 is a schematic view showing a schematic configuration of an image pickup device according to another modified change of the first embodiment of the present disclosure.

In addition, although the embodiments and the like have been described by exemplifying the case where the image pickup device is configured and structured as the radiation image pickup device, the present disclosure can also be applied to an image pickup device other than the radiation image pickup device (and an image pickup display system other than the radiation image pickup display system). Specifically, for example, like an image pickup device 3 shown in FIG. 9, a configuration may also be adopted such that the sensor substrate 10, 10A described above in the embodiments and the like is provided, and the wavelength converting member 20 is omitted (not provided). Even with such a configuration, since the shield electrode 128, 128A described above in the embodiments and the like is provided within the sensor substrate 10, 10A, it is possible to obtain the same effects.

It is noted that the present disclosure can also adopt the following constitutions.

(1) An image pickup device including:
a sensor substrate;
the sensor substrate including
plural photoelectric conversion elements and driving elements for the plural photoelectric conversion elements which are formed on a substrate,
wirings electrically connected to the driving elements, and
a shield electrode disposed in a region between the plural photoelectric conversion elements and the wirings in a layer different from that of the wirings.

(2) The image pickup device described in the paragraph (1), in which the shield electrode is provided on an upper layer side with respect to the wirings.

(3) The image pickup device described in the paragraph (2), in which in each of the photoelectric conversion elements, a lower electrode, a photoelectric conversion layer, and an upper electrode are laminated in this order; and
the shield electrode is formed in the same layer as that of the lower electrode.

(4) The image pickup device described in the paragraph (3), in which the shield electrode is formed so as to cover a circumference of corresponding one of the wirings.

(5) The image pickup device described in the paragraph (4), in which the sensor substrate includes:
an interlayer insulating film which is provided in a layer between corresponding one of the wirings and the lower electrode and which has a separation trench separating the corresponding one of the wirings and a circumference thereof; and
the shield electrode is formed so as to cover above the interlayer insulating film and an inner surface of the separation trench.

(6) The image pickup device described in any one of the paragraphs (1) to (5), in which a predetermined reference electric potential is applied to the shield electrode.

(7) The image pickup device described in any one of the paragraphs (1) to (6), in which the wirings are signal lines through which image pickup signals are read out from the photoelectric conversion elements through the drive elements.

(8) The image pickup device described in any one of the paragraphs (1) to (7), in which each of the photoelectric conversion elements is composed of a PIN type photodiode.

(9) The image pickup device described in any one of the paragraphs (1) to (8), further including:
a wavelength converting member disposed on the sensor substrate, and wavelength-converting a radiation made incident thereto into a light having a wavelength in a sensitivity range of each of the photoelectric conversion elements;
in which the image pickup device is configured and structured as a radiation image pickup device.

(10) The image pickup device described in the paragraph (9), in which the radiation is an X-ray.

(11) An image pickup display system including:
an image pickup device having a sensor substrate; and
a display device carrying out image display based on an image pickup signal obtained from the image pickup device;
the sensor substrate including
plural photoelectric conversion elements and driving elements for the plural photoelectric conversion elements which are formed on a substrate,
wirings electrically connected to the driving elements, and
a shield electrode disposed between the plural photoelectric conversion elements and the wirings in a layer different from that of the wirings.

(12) A method of manufacturing an image pickup device, the manufacturing method including:
forming a sensor substrate;
the forming of the sensor substrate including
forming plural photoelectric conversion elements and driving elements for the plural photoelectric conversion elements on a substrate;
forming wiring electrically connected to the driving elements; and
forming a shield electrode in a region between the plural photoelectric conversion elements and the wirings in a layer different from that of the wirings.

The present application contains subject matter related to that disclosed in Japanese Priority Patent Application JP 2012-019799 filed in the Japan Patent Office on Feb. 1, 2012, the entire content of which is hereby incorporated by reference.

What is claimed is:

1. An image pickup device, including a sensor substrate, said sensor substrate comprising:
plural photoelectric conversion elements and driving elements for said plural photoelectric conversion elements which are formed on a substrate;

wirings electrically connected to said driving elements; and a shield electrode disposed in a region between said plural photoelectric conversion elements and said wirings in a layer different from that of said wirings, wherein said shield electrode is provided on an upper layer side with respect to said wirings, wherein in each of said photoelectric conversion elements, a lower electrode, a photoelectric conversion layer, and an upper electrode are laminated in this order, and wherein said shield electrode is disposed in a layer that is different from a layer of said wiring and that is the same as a layer of said lower electrode.

2. The image pickup device according to claim 1, wherein said shield electrode is formed so as to cover a circumference of corresponding one of said wirings.

3. The image pickup device according to claim 2, wherein said sensor substrate includes:

an interlayer insulating film which is provided in a layer between corresponding one of said wirings and said lower electrode and which has a separation trench separating the corresponding one of said wirings and a circumference thereof; and said shield electrode is formed so as to cover above said interlayer insulating film and an inner surface of said separation trench.

4. The image pickup device according to claim 1, wherein a predetermined reference electric potential is applied to said shield electrode.

5. The image pickup device according to claim 1, wherein said wirings are signal lines through which image pickup signals are read out from said photoelectric conversion elements through said drive elements.

6. The image pickup device according to claim 1, wherein each of said photoelectric conversion elements is composed of a positive intrinsic negative type photodiode.

7. The image pickup according to claim 1, further comprising:

a wavelength converting member disposed on said sensor substrate, and wavelength-converting a radiation made incident thereto into a light having a wavelength in a sensitivity range of each of said photoelectric conversion elements;

wherein said image pickup device is configured and structured as a radiation image pickup device.

8. The image pickup device according to claim 7, wherein the radiation is an X-ray.

9. An image pickup display system, including:

an image pickup device having a sensor substrate; and a display device carrying out image display based on an image pickup signal obtained from said image pickup device, said sensor substrate comprising:

plural photoelectric conversion elements and driving elements for said plural photoelectric conversion elements which are formed on a substrate;

wirings electrically connected to said driving elements; and a shield electrode disposed between said plural photoelectric conversion elements and said wirings in a layer different from that of said wirings, wherein said shield electrode is provided on an upper layer side with respect to said wirings, wherein in each of said photoelectric conversion elements, a lower electrode, a photoelectric conversion layer, and an upper electrode are laminated in this order, and wherein said shield electrode is disposed in a layer that is different from a layer of said wiring and that is the same as a layer of said lower electrode.

10. A method of manufacturing an image pickup device, including forming a sensor substrate, the forming of said sensor substrate comprising:

forming plural photoelectric conversion elements and driving elements for said plural photoelectric conversion elements on a substrate;

forming wiring electrically connected to said driving elements; and forming a shield electrode in a region between said plural photoelectric conversion elements and said wirings in a layer different from that of said wirings, wherein said shield electrode being provided on an upper layer side with respect to said wirings, wherein in each of said photoelectric conversion elements, a lower electrode, a photoelectric conversion layer, and an upper electrode are laminated in this order, and wherein said shield electrode is disposed in a layer that is different from a layer of said wiring and that is the same as a layer of said lower electrode.

* * * * *